United States Patent [19]

Furihata

[11] Patent Number: 4,465,542

[45] Date of Patent: Aug. 14, 1984

[54] ADHESIVE COMPOSITION

[75] Inventor: Toshikazu Furihata, Ichihara, Japan

[73] Assignee: Mitsui Petrochemical Industries, Ltd., Tokyo, Japan

[21] Appl. No.: 467,207

[22] Filed: Feb. 17, 1983

[30] Foreign Application Priority Data

Feb. 19, 1982 [JP] Japan ................................ 57-26548
May 21, 1982 [JP] Japan ................................ 57-86782
Nov. 15, 1982 [JP] Japan ............................... 57-200046

[51] Int. Cl.$^3$ .............................. C09J 3/16; C09J 5/02
[52] U.S. Cl. ................................ 156/330; 156/307.1; 428/418; 428/460; 428/461; 523/428; 523/429; 523/439; 523/466; 523/467; 525/113; 427/54.1
[58] Field of Search ............... 525/113; 523/428, 429, 523/439, 466, 467; 428/418, 460, 461; 427/54.1; 156/330, 307.1

[56] References Cited

U.S. PATENT DOCUMENTS

| | | | |
|---|---|---|---|
| 3,547,869 | 12/1970 | Seeber et al. | 523/428 |
| 3,655,818 | 4/1972 | McKnown | 523/428 |
| 3,855,176 | 12/1974 | Skidmore | 523/439 |
| 3,894,112 | 7/1975 | Pagel | 525/113 |
| 3,894,113 | 7/1975 | Pagel | 525/113 |
| 3,926,903 | 12/1975 | Scola | 525/113 |
| 3,926,904 | 12/1975 | Scola | 525/113 |
| 3,963,666 | 6/1976 | Schreiber et al. | 523/428 |
| 4,025,578 | 5/1977 | Siebert | 525/122 |
| 4,131,590 | 12/1978 | De Frank | 523/400 |
| 4,271,052 | 6/1981 | Blackshaw | 524/574 |
| 4,337,111 | 6/1982 | Kaufmann et al. | 428/420 |
| 4,383,060 | 5/1983 | Dearlove et al. | 523/429 |
| 4,419,479 | 12/1983 | Springer | 524/522 |

FOREIGN PATENT DOCUMENTS 21450 2/1982 Japan ................................. 523/113

Primary Examiner—Herbert J. Lilling
Attorney, Agent, or Firm—Armstrong, Nikaido, Marmelstein & Kubovcik

[57] ABSTRACT

An adhesive composition containing: (a) a nitrogen atom-free epoxy compound, (b) a poly N-glycidyl type epoxy resin, (c) a nitrile rubber having a carboxyl group, and optionally (d) a finely divided silica, a clay substance treated with an onium compound, or a mixture thereof. The compounding ratio by weight of the components (a), (b), (c) and (d) is as follows:

$0.05 \leq (b)/(a) \leq 19$
$0.05 \leq [(a)+(b)]/(c) \leq 1.75$
$0.0125 \leq (d)/(c) \leq 0.75$ This adhesive composition has excellent adhesion strength, soldering heat resistance, flexibility, and chemical resistance, and has a small resin flow property.

6 Claims, No Drawings

ADHESIVE COMPOSITION

BACKGROUND OF THE INVENTION

1. Field of the Invention

The present invention relates to an adhesive composition. More specifically, it relates to an adhesive composition having excellent adhesion, soldering heat resistance (i.e., heat resistance against soldering), flexibility, and chemical resistance and having small resin flow, suitable for use in the production of a flexible printed board materials (or flexible printed circuit, "FPC" below).

2. Description of the Prior Art

Heat stable plastic films such as polyimide films, or polyester films have long been used in the production of FPC. For instance, metallic foils such as copper foils and aluminum foils are adhered to polyimide films and polyester films by using adhesives to form FPC. These FPC are used in various application fields including cameras, pocket or desk calculators and telephone sets. The adhesives for use in the production of FPC should have various necessary characteristics. Not only must they bond the films and metallic foils, but they also must have electric characteristics, soldering heat resistance (e.g., resistance to blistering or other abnormalities upon immersion in a molten solder having a high temperature), chemical resistance against solvents such as methylene chloride used for dissolving portions other than the circuits, and flexibility required for free three-dimensional circuits. Futhermore, the increasing production and greater design sophistication and complexity of FPC have resulted in demand for higher performance adhesives of greater reliability. Known adhesives heretofore used for FPC include fluoro resins, epoxy-novolak resins, nitrile-phenol resins, polyester resins, and acrylic resins. However, no satisfactory adhesive having all of the above-mentioned characteristics and requirements has yet been developed.

Furthermore, in order to improve the insulating characteristics of flexible circuits, an insulation film having an adhesive layer coated on one surface thereof is often attached to the printed board material comprising a film and a metallic foil after the desired circuit processing. However, when the insulation film is contact bonded upon heating to the printed board material, an undesirable phenomenon, which is referred to as "resin flow" occurs, wherein the adhesive layer of the insulation film is squeezed out to the pad portion.

SUMMARY OF THE INVENTION

Accordingly, the main objects of the present invention are to eliminate the above-mentioned disadvantages of the prior art and to provide an adhesive composition having excellent adhesion, soldering heat resistance, flexibility, and chemical resistance and having small resin flow, suitable for use in the production of FPC.

Other objects and advantages of the present invention will be apparent from the following description.

In accordance with the present invention, there is provided an adhesive composition comprising: (a) a nitrogen atom-free epoxy compound, (b) a poly N-glycidyl type epoxy resin, and (c) a nitrile rubber having a carboxyl group, the compounding ratio by weight of the components (a), (b), and (c) in the composition being as follows:

$0.05 \leq (b)/(a) \leq 19$ $0.05 \leq [(a)+(b)]/(c) \leq 1.75$

In accordance with the present invention, there is also provided an adhesive composition comprising: (a) a nitrogen atom-free epoxy compound, (a) a poly N-glycidyl type epoxy resin, (c) a nitrile rubber having a carboxyl group, and (d) a finely divided silica, a clay substance treated with an onium compound, or a mixture thereof, the compounding ratio by weight of the components (a), (b), (c) and (d) being as follows:

$0.05 \leq (b)/(a) \leq 19$ $0.05 \leq [(a)+(b)]/(c) \leq 1.75$ $0.0125 \leq (d)/(c) \leq 0.75$

DESCRIPTION OF THE PREFERRED EMBODIMENTS

Nitrogen atom-free epoxy compounds usable as component (a) in the first and second adhesive compositions of the present invention are: (i) glycidyl ethers of alcohols such as diglycidyl ethers of polyethylene glycol having the formula

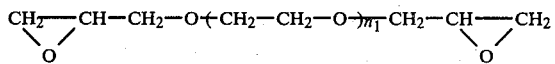

wherein $n_1$ is 1 to 40, diglycidyl ethers of polypropylene glycol having the formula

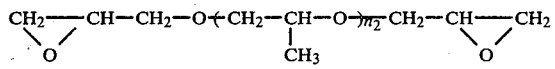

wherein $n_2$ is 1 to 40, diglycidyl or triglycidyl ethers of glycerine, triglycidyl ethers of trimethylolpropane, diglycidyl ethers of 1,4-butanediol, diglycidyl ethers of 1,6-hexanediol, and diglycidyl ethers of neopentyl glycol; (ii) glycidyl esters of carboxylic acids such as diglycidyl esters of hexahydrophthalic acid (e.g., available from Showa Denko K.K. under Trademark "SHODYNE 540"), diglycidyl esters of phthalic acid (e.g., available from Showa Denko K.K. under Trademark "SHODYNE 508"), and glycidyl esters of higher fatty acids (e.g., available from Shell Chemical Co., Ltd. under Trademark "CARDURA-E"); (iii) glycidyl ethers of phenols such as commercially available bisphenol A type epoxy resins having the general formula

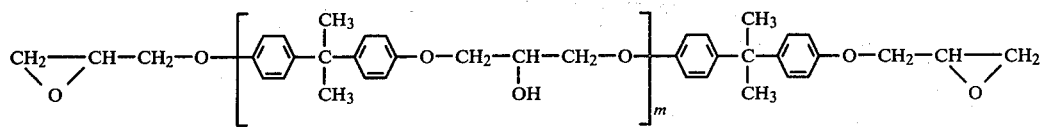

wherein m is 0 to 26, desirably having an epoxy equivalent of 170 to 4000, polyglycidyl ethers of phenol novolaks having the formula

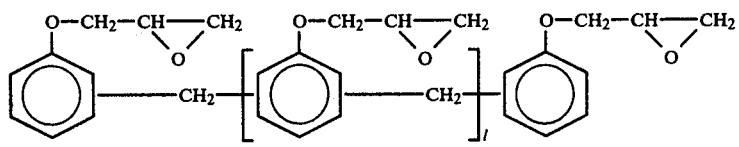

wherein l is 0 to 2, polyglycidyl ethers of cresol novolaks having the formula

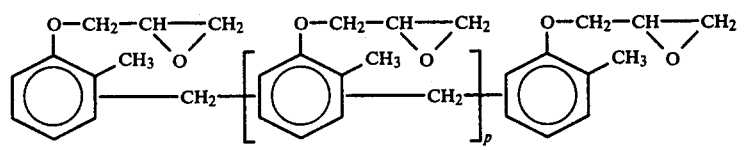

wherein p is 0 to 2, polyglycidyl ethers of bromophenol novolaks having the formula

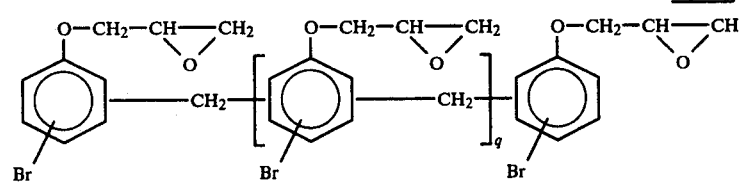

wherein q is 0 to 2, diglycidyl ethers of resorcinol, hydroquinone, or catechol, diglycidyl ethers of bis (hydroxyphenyl) methane (i.e., bisphenol F), phenylglycidyl ethers, m-, or p-cresylglycidyl ethers, dibromocresylglycidyl ethers, epoxy compounds obtained from the reaction of polybutadiene having both terminal carboxy groups to bisphenol A type epoxy resins (e.g., available from Nippon Soda Co., Ltd under the Trademark "NISSO EPOXYN EPB"); and (iv) epoxy compounds having a skeleton of

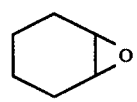

in the molecule thereof such as bis(3,4-epoxycyclohexyl)adipate having the formula

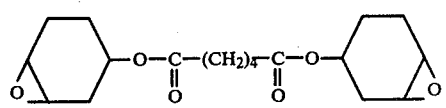

3,4-epoxycyclohexylmethyl 3,4-epoxycyclohexane carboxylate having the formula

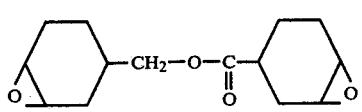

bis(3,4-epoxycyclohexylmethyl)oxalate having the formula

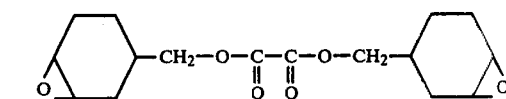

bis(3,4-epoxy-6-methylcychohexylmethyl)adipate having the formula

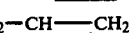

bis(3,4-epoxycyclohexylmethyl)pimelate having the formula

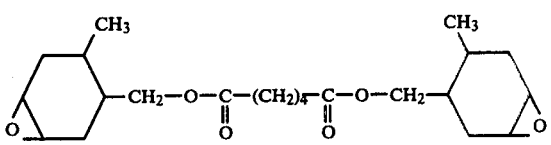

3,4-epoxy-1-methylcyclohexylmethyl 3,4-epoxy-1-methylcyclohexane carboxylate having the formula

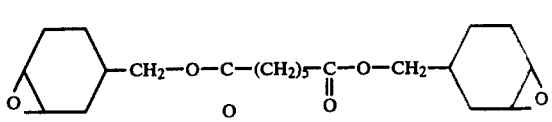

6-methyl-3,4-epoxycyclohexylmethyl 6-methyl-3,4-epoxycyclohexane carboxylate having the formula

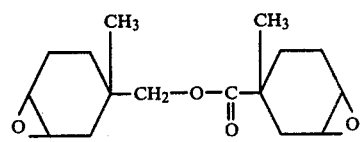

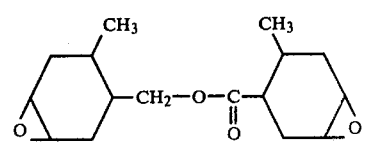

3,4-epoxy-5-methyl-cyclohexylmethyl 3,4-epoxy-5-methylcyclohexane carboxylate having the formula

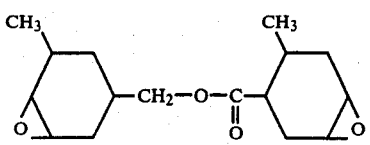

Other epoxy compounds such as

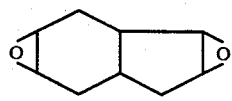

Desirable components (a) are ethylene glycol diglycidyl ether, polypropylene glycol glycidyl ether ($n_2 \approx 7$), SHODYNE 540, epoxy resins ($n = 0$–2.5) derived from bisphenol A, EPOXYN EPB-42 (epoxyequivalent = 1600–2100), resorcine diglycidyl ether, hydroquinone glycidyl ether, bisphenol F, bis(3,4-epoxycyclohexyl)adipate, 3.4-epoxy cyclohexylmethyl 3,4-epoxycyclohexane carboxylate, and novolak type epoxy resin.

Poly N-glycidyl type epoxy resins usable as component (b) in the first and second adhesive compositions of the present invention are those having the general formula:

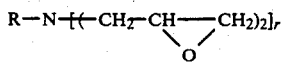

wherein r is an integer of 1 to 6. These compounds have a plurality of glycidyl groups bonded to a nitrogen atom or atoms. These compounds can be prepared from the corresponding amines and epihalohydrine. Furthermore, epoxy resins may further be reacted with the amino groups of the intermediate to form high molecular weight compounds. Examples of the compounds usable as component (b) in the present invention are:

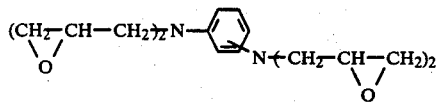

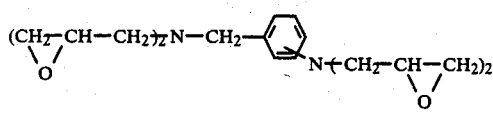

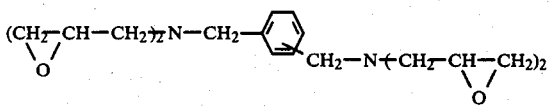

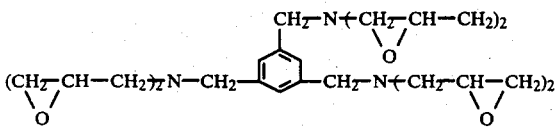

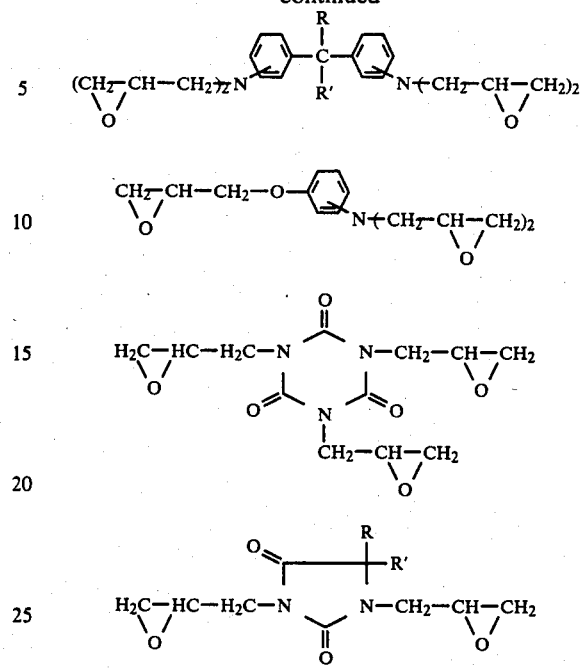

wherein R and R' are independently hydrogen, or an alkyl group having 1 to 5 carbon atoms. Desirable components (b) are N,N,N',N'-tetraglycidyl m-(or p-)phenylenediamine, N,N,N',N'-tetraglycidyl m-(or p-)xylylenediamine, N,N,N',N',N'',N''-hexaglycidyl-1,3,5-triamino-methylbenzene, N,N,N',N'-tetraglycidyl diaminodiphenyl methane, and triglycidyl p-aminophenol N,N',N''-triglycidyl isocyanurate.

Nitrile rubbers having carboxyl groups usable as component (c) in the first and second adhesive compositions of the present invention are carboxylated acrylonitrile and butadiene copolymer rubbers obtained from the copolymerization of acrylonitrile and butadiene in a mole ratio of approximately 5/95 to approximately 45/55, followed by the carboxylation of the terminal portions of the copolymer, and terpolymers of acrylonitrile, butadiene and carboxyl group containing polymerizable monomers such as acrylic acid. Desirable carboxyl group contents in the copolymer rubbers are approximately 1 to 8% by weight. Examples of such commercially available nitrile rubbers are those available from The B. F. Goodrich Co. under Trademark "Hycar CTBN", "Hycar CTBNX" and "Hycar 1072", those available from Nippon Zeon Co., Ltd. under Trademark "NIPOL 1072".

According to the present invention, the compounding ratio by weight of the components (a), (b) and (c) in the first and second adhesive compositions should be as follows.

$0.05 \leq (b)/(a) \leq 19$ $0.05 \leq [(a)+(b)]/(c) \leq 1.75$

A ratio (b)/(a) of less than 0.05 in the adhesive composition results in an undesirable decrease in heat stability and adhesion strength. Contrary to this, a ratio (b)/(a) of more than 19 results in an undesirable decrease in adhesion strength whereas heat resistance is good. The ratio (b)/(a) is desirably within the range of 0.08 to 13, more desirably 0.2 to 6.

A ratio $[(a)+(b)]/(c)$ of less than 0.05 in the adhesive composition results in the undesirable decrease in both adhesion strength and heat resistance. Contrary to this, a ratio [(a)+(b)/(c) of more than 1.75 results in a large decrease in adhesion strength. The ratio [(a)+(b)]/(c) is desirably within the range of 0.09 to 0.7, more desirably 0.15 to 0.65.

Finely divided silica, clays treated with onium compounds and any mixtures thereof can be used as component (d) in the second adhesive composition of the present invention.

Examples of finely divided silica usable as component (d) in the present invention are amorphous silica obtained from the combustion hydrolysis of silicon tetrachloride in an oxyhydrogen flame, such as those available from Nippon Aerosil Co., Ltd. under Trademark "AEROSIL".

Clay substances treated with onium compounds usable as component (d) in the present invention are those obtained by treating clay substances such as bentonite, montmorilonite, and sepiolite with onium compounds such as ammonium compounds, phosphonium compounds, and sulfonium compounds to improve the swelling property of the clay substances to organic compounds. These treated clay substances are sometimes called "organic clay substances" or "organic clay" and the production and the properties are disclosed in detail in, for example, U.S. Pat. No. 2,531,427.

Of the above-mentioned onium compounds, the use of ammonium compounds is desirable. The salts of aliphatic amines, alicyclic amines, aromatic amines, and heterocyclic amines as well as the salts of primary, secondary, and tertiary amines, and quaternary ammonium compounds can also be desirably used. The treatment is generally carried out by suspending clay substances in water, followed by the addition of an aqueous onium compound solution. The clay substances treated by the onium compound can be recovered by, for example, filtration, washing, drying, and grinding. These treated clay substances are commercially available from N.L. Industries, Inc. under Trademark "BENTON 27", "BENTON 34", "BENTON 38" and "BENTON SA-38". These substances can desirably be used in the present invention. The use of these substances in the present adhesive composition greatly improves the adhesive strength and the resin flow of the adhesive composition.

According to the second embodiment of the present invention, the above-mentioned component (d) should be incorporated into the adhesive composition containing the components (a), (b), and (c) in a weight ratio of the component (d) to the component (c) [i.e., (d)/(c)] of 0.0125 to 0.75, desirably 0.06 to 0.36. A ratio (d)/(c) of less than 0.0125 results in a decrease in adhesion strength and an extensive resin flow to a pad portion during the adhesion operation under pressure. Contrary to this, a ratio (d)/(c) of more than 0.75 results in a decrease in the adhesion strength and in the formation of a nonuniform adhesive layer, which is aesthetically undesirable when transparent film is used.

In the production of the first and second adhesive compositions of the present invention, the above-mentioned components (a), (b), and (c), or the components (a), (b), (c), and (d) can simply be mixed together in any conventional manner. Optionally, the components (a) and (b), the components (b) and (c), or the components (a), (b), and (c) may previously be reacted to desirably adjust the viscosity or the tackiness of the adhesive composition.

The adhesive compositions of the present invention can contain any conventional curing agents for the epoxy resin. Examples of such curing agents are aliphatic and aromatic polyamines, acid anhydrides, the hydrazides derived from polycarboxylic acids, imidazole derivatives, dicyanodiamide, guanidine derivatives, and biguamide derivatives. Typical examples of these curing agents are diaminodicyclomethane, bis(4-amino-3-methylcyclohexyl)methane, diaminodiphenylmethane, diaminodiphenylsulfone, 4,4'-diamino-3,3'-dichlorodiphexylmethane, phthalic anhydride, chlorendic acid anhydride, and commercially available products such as those from Shikoku Chemicals Corp. under Trademark "CURESOL 2E4MZ-AZINE", "CURESOL 2E4MZ-CN", and "CURESOL 2PZ-CN".

Curing accelerators can be used together with the curing agents to accelerate the curing. Examples of the curing accelerators are imidazole derivatives, amine-boron trifluoride complexes, commercially available products from San-Abbott Ltd. under Tradename "DBU" (i.e., diazabicycloundecene), "U-CAT-SA No. 1" (i.e., DBU.phenol salt), and "U-CAT-SA No. 102" (i.e., DBU.octylic acid salt).

The first and second adhesive compositions of the present invention are generally applied to materials or substances to be adhered to in the form of a solution. Examples of the solvents to dissolve the compositions are methyl ethyl ketone, methyl isobutyl ketone, dioxane, ethanol, methyl cellosolve, ethyl cellosolve, and dimethylformamide. These solvents can be used alone or in any mixture thereof.

In the application of the present adhesive compositions, the present adhesive composition solution is first applied to the materials or substances to be adhered (e.g., films). After B-staging (i.e., the adhesive composition is allowed to be a semi-cured state, which can be melted upon heating), the films are adhered to metallic foils under pressure upon heating by means of a roll-type or batch-type press to obtain FPC having excellent characteristics. The contact bonding or adhesion is generally carried out at a temperature of 80° to 300° C. under a pressure of 5 to 200 kgf/cm$^2$. The postcuring at a temperature of 100° to 350° C. further improves the heat stability. Various stabilizers can be added to the present adhesive compositions to prevent the oxidation and the decomposition of the carboxylated nitrile rubbers and the epoxy resins when a long term heating is required during the contact bonding. The use of non-staining antioxidants are desirable. Examples of such antioxidants are: hindered phenol type stabilizers such as "IRGANOX 1010" (Trademark, available from Ciba Geigy Ltd., tetrakis methylene-3-(3',5'-di-t-butyl-4'-hydroxyphenyl)propionate methane), "IONOX 220" (Trademark, available from Shell Chemical Co., Ltd., 4,4'-methylene-bis(2,6-di-t-butyl)phenol), and "IONOX 330" (Trademark, available from Shell Chemical Co., Ltd., 1,3,5-trimethyl-2,4,6-tris(3,5-di-t-butyl-4-hydroxylbenzyl)benzene); thiobisphenol type stabilizers such as "NOKLAC 300" (Trademark, available from Ouchi Shinko Chemical Industrial Co., Ltd., 4,4'-thiobis(6-t-butyl-3-methyl)phenol), and "CAO-6" (Trademark, available from Ashland Chemical Co., Ltd., 2,2'-thiobis(6-butyl-4-methyl)phenol); and "DLTP" (Trademark, available from Yoshitomi Pharmaceutical Industries, Ltd. dilaurylthiodipropionate).

In addition, laminating materials such as woven or non-woven glass fabrics can be integrally laminated into the contact bonded laminates such as FEP.

EXAMPLE

The present invention is further illustrated by, but is by no means limited to, the following examples in which all percentages are expressed on a weight basis unless otherwise specified.

EXAMPLE 1

An 18.0 g amount of bisphenol A type epoxy resin "R-301" (manufactured by Mitsui Petrochemical Epoxy Corp., an epoxy equivalent of 470 to 490 and a softening point of 62° to 70° C.), 80.0 g of carboxylated nitrile rubber "HYCAR CTBN 1300×13" (manufactured by The B. F. Goodrich Co., Ltd., a molecular weight of about 3500, a carboxyl group content of 2.5% and a viscosity of 550,000 cps at 27° C.) and 80.0 g of methyl cellosolve were charged into a 300 cm$^3$ separable flask. The mixture was heated, while stirring, at a temperature of 50° C. to 60° C. to form a uniform solution. After cooling to room temperature, 17.0 g of N,N,N',N'-tetraglycidyl-m-xylylenediamine "TETRADO-X" (manufactured by Mitsubishi Gas Chemical Company, Inc. an epoxy equivalent of 95 to 110 and a viscosity of 2000 to 4000) and 12.5 g of 3,3'-diaminodiphenylsulfone (manufactured by Mitsui Toatsu Chemicals, Inc.) were further charged into the flask and were dissolved in the mixture while stirring. Thus, an adhesive composition was prepared.

The adhesive composition prepared above was applied to the surface of KAPTON film (Trademark, polyimide film manufactured by E. I. Du Pont de Nemours & Co.). The film was dried at a temperature of 150° C. for 12 minutes in an air oven. Then, the film was laminated on an electroytic copper foil in such a manner that the adhesive layer on the film was brought into contact with the matte surface of the copper foil. The laminate was subjected to a contact bonding operation at a temperature of 170° C. under a pressure of 25 kg/cm$^2$ for 90 minutes in a press. The thickness of the adhesive layer of this laminated sample was 22 to 25 μm (micrometer). The T-peel strength of this sample determined according to a JIS (Japanese Industrial Standards) K-6854-1973 method was 1.6 kg/cm. No abnormal phenomena such as blistering occured when the laminated sample was floated in a soldering bath at a temperature of 280° C. for 2 minutes with the copper foil surface face down.

COMPARATIVE EXAMPLES 1 TO 3

Adhesive compositions were prepared in the same manner as in Example 1, except that one of the three components used in Example 1 was omitted as shown in Table 1.

The bonding of the KAPTON film and the copper foil was carried out by using the adhesive compositions prepared above in the same manner as described in Example 1 under the drying conditions of 150° C.×12 minutes and the press conditions of 170° C.×25 kg/cm$^2$×90 minutes.

The results are shown in Table 1.

EXAMPLES 2 TO 5

The experiments of Example 1 were repeated, except that the curing agents listed in Table 2 were used. The press conditions were 170° C.×25 kg/cm$^2$×90 minutes.

The results are shown in Table 2.

TABLE 1

| Comparative Example No. | Hycar CTBN 1300 × 13 (g) | R-301 (g) | TETRADO-X (g) | Methyl cellosolve (g) | 3,3'-Diamino-diphenylsulfone (g) | T-peel strength (kg/cm) | Soldering heat resistance* at 280° C. |
|---|---|---|---|---|---|---|---|
| 1 | 80.0 | 40.0 | — | 80.0 | 5.2 | 0.5 | less than 5 sec |
| 2 | 80.0 | — | 25.0 | 80.0 | 16.5 | 0.7 | more than 2 min |
| 3 | — | 18.0 | 17.0 | 40.0 | 12.5 | 0.3 | less than 5 sec |

*Time when blistering occurred.

TABLE 2

| Example No. | Curing agent (addition amount g) | Drying cond. at 150° C. (min) | T-peel strength (kg/cm) | Soldering heat resistance*[1] 280° C. |
|---|---|---|---|---|
| 2 | 4,4'-Diaminodiphenylmethane (9.8) | 6 | 1.6 | more than 2 min |
| 3 | Dicyandiamide*[2] (2.5) | 15 | 1.7 | " |
| 4 | Phthalic anhydride (12.0) | 6 | 1.3 | " |

TABLE 2-continued

| Example No. | Curing agent (addition amount g) | Drying cond. at 150° C. (min) | T-peel strength (kg/cm) | Soldering heat resistance*[1] 280° C. |
| --- | --- | --- | --- | --- |
| 5*[3] | 2E4MZ-CN*[4] (3.2) | 6 | 1.8 | " |

*[1]Time when blistering occurred.
*[2]0.2 g of curing accelerator 2E4MZ-AZINE was further added.

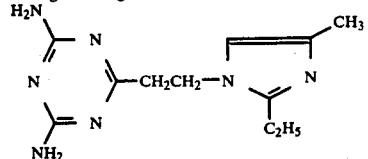

*[3]70.0 g of Hycar CTBN 1300 × 13 was used only in this example.
*[4]

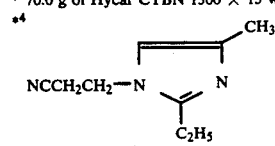

EXAMPLE 6

Example 1 was repeated, except that 18.0 g of triglycidylisocyanulate "TEPIC" (manufactured by Nissan Chemical Industries, Ltd., an epoxy equivalent of 103 to 105 and a melting point of 90° C. to 115° C.) and 80.0 g of N,N-dimethyl formamide were used instead of TETRADO-X and methylcellosolve, respectively.

The T-peel strength of the sample thus prepared was 1.6 kg/cm. The soldering heat resistance of the sample was such that abnormal phenomena such as blistering did not occur when the sample was floated on a solder bath at a temperature of 280° C. for 2 minutes.

EXAMPLE 7

The bonding of LUMILAR film (polyester film manufactured in Toray Industries, Inc.) and a copper foil was carried out by using the adhesive composition of Example 3.

The T-peel strength was 1.3 kg/cm.

EXAMPLE 8

A 34.0 g amount of carboxylated nitrile rubber "NIPOL 1072" (manufactured by Nippon Zeon Co., Ltd., a number-average molecular weight of 30,000, a Mooney viscosity of 30 to 60), which was previously masticated on rolls and cut into small chips, 51.0 g of carboxylated nitrile rubber "HYCAR CTBN" 1300×13, 25.0 g of bisphenol F type epoxy resin "EPICRON 830" (manufactured by Dainippon Ink and Chemicals Incorporated, an epoxy equivalent of 174 and a viscosity of 3800 cps at 25° C.), 22.0 g of N,N,N'N,'-tetraglycidyl-m-xylylene diamine "TETRADO-X" and 240.0 g methyl ethyl ketone were charged into a 500 cm³ separable flask and dissolved at room temperature to prepare a chief ingredient solution.

A 23.9 g amount of 3,3'-diaminodiphenyl sulfone and 1.0 g of diazabicycloundecene, as curing agent components, were dissolved in 99.0 g of methyl cellosolve. This solution was mixed with the above-prepared chief ingredient solution to prepare an adhesive composition.

The adhesive composition thus prepared was applied to a surface of KAPTON film having a thickness of 25 μm. The film was dried at a temperature of 130° C. for 10 minutes in an air oven. Then, the film was laminated on a ½ oz. electrolytic copper foil in such a manner that the adhesive layer of the film was contacted with the matte surface of the copper foil. The laminate was subjected to a contact bonding at a temperature of 170° C. under a pressure of 40 for 40 minutes in a press. The thickness of the adhesive layer of this laminated sample was 22 to 25 μm. The T-peel strength of this sample was 1.3 kg/cm. Abnormal phenomena such as blistering were not observed when the sample was floated in a soldering bath at a temperature of 280° C. for 30 seconds with the copper foil surface face down.

Furthermore, the adhesive composition prepared above was coated on KAPTON film. After the adhesive composition was dried at a temperature of 130° C. for 10 minutes, a circular opening having a diameter of 5 mm was opened in the film. The film was bonded to the mirror surface of the copper foil. The laminate was heated at a temperature of 170° C. for 2 minutes in a press and, then, was contact bonded at a temperature of 170° C. under a pressure of 40 kg/cm² for 40 minutes. The thickness of the adhesive layer was 22 to 25 μm. The maximum flow length of the adhesive composition was less than 0.1 mm.

EXAMPLE 9

A chief ingredient was prepared in the same manner as described in Example 8, except that a solution of 25.0 g of hydroquinone diglycidyl ether (an epoxy equivalent of 123 and a softening point of 72° to 77° C.) dissolved in 200.0 g of chloroform was used instead of EPICRON 830. A curing agent component previously prepared by dissolving 24.6 g of 3,3'-diaminodiphenyl sulfone and 1.0 g of diazabicycloundecene in 97.7 g of methylcellosolve was added to the chief ingredient to prepare an adhesive composition. Then, the procedure of Example 8 was repeated.

The T-peel strength of the sample was 1.1 kg/cm. Abnormal phenomena such as blistering were not observed when the sample was floated in a soldering bath at a temperature of 280° C. for 30 seconds. The resin flow to a mirror surface was less than 0.1 mm.

EXAMPLE 10

A 14.0 g amount of "BENTON 27" (manufactured by N. L. Industries, Inc. montomorilonite treated with trialkylallylammonium salt, a specific gravity of 1.8 at 25° C.) having a size passing through a 150 mesh sieve was charged into a 500 cm³ separable flask. Thereafter, 121.8 g of toluene was added to the flask, whereby the montomorilonite was thoroughly wetted and, then, 4.2 g of 95% ethanol was added and stirred to form a pre-gel (soft creamy gel). 85.0 g of NIPOL 1072 previously masticated on rolls and cut into small chips. 30.0 g of polypropylene glycol diglycidyl ether "EPOLITE 400P" (manufactured by Kyoeisha Chemical Co., Ltd., an epoxy equivalent of 330 to 360, and a viscosity of 15 to 75 cps at 25° C.) were added to the pre-gel and the mixture was dissolved in 216.5 g of methyl ethyl ketone. Then, 30.0 g of TETRADO-X was added to the solution obtained above. Thus, a chief ingredient solution was prepared.

To the chief ingredient solution, a solution of 23.5 g of 3,3'-diaminodiphenyl sulfone and 1.0 g of diazabicycloundecene dissolved in 101.8 g of methyl cellosolve was added as a curing agent component. Thus, an adhesive composition was prepared.

The adhesive composition was applied to a surface of KAPTON film and was dried at a temperature of 130° C. for 6 minutes. Thereafter, the procedure of Example 8 was repeated.

The T-peel strength of the sample thus obtained was 1.2 kg/cm. No abnormal phenomenon was observed when the sample was floated on a soldering bath at a temperature of 280° C. for 30 seconds. The resin flow was less than 0.05 mm.

EXAMPLES 11 TO 16

From 14.0 g of BENTON 27, 121.8 g of toluene, and 4.2 g of 95% ethanol, a pre-gel was prepared. Then, 34.0 g of NIPOL 1072 and 51.0 g of HYCAR CTBN 1300×13 were added to the pre-gel and, then, the mixture was dissolved in 216.5 g of methyl ethyl ketone. Thereafter, the mixtue was homogeneously dispersed by agitating the same at a high speed for 50 minutes in a homomixer. The epoxy resin and the curing agent component listed in Table 3 were added thereto. Thus, an adhesive composition was prepared. The adhesive composition was used to bond KAPTON film and the matte surface of copper foil. The drying condition was 130° C.×6 minutes and the press condition was 170° C.×40 minutes.

The results are shown in Table 3.

TABLE 3

| Example No. | 11 | 12 | 13 | 14 | 15 | 16 |
|---|---|---|---|---|---|---|
| Epoxy resin in chief ingredient | EPOLITE 40E*1 27.0 g Ciba-Geigy 0510*2 25.0 g | m,p-cresylglycidyl ether*3 20.0 g TETRADO-X 30.0 g | EPB-42M*4 100.0 g TETRADO-X 35.0 g | SHODYNE 540*5 29.0 g TETRADO-X 27.0 g | EPPN-201*6 20.0 g N,N,N',N',N'',N''— hexaglycidyl- 1,3,5,triamino- methylbenzene 25.0 g | ERL-4221*7 23.0 g TETRADO-X 23.0 g |
| Curing agent component | | | | | | |
| DDS *8 | 27.4 g | 25.7 g | 22.0 g | 23.3 g | 23.9 g | 24.3 g |
| DBU *9 | 1.0 g | 1.0 g | 1.0 g | 1.0 g | 1.0 g | 1.0 g |
| Methyl cellosolve | 95.9 g | 97.1 g | 122.0 g | 98.7 g | 97.6 g | 67.4 g |
| T-peel strength (kg/cm) | 1.1 | 1.2 | 1.2 | 1.2 | 1.0 | 1.1 |
| Soldering heat resistance at 280° C. for 30 min. | No abnormal Phenomenon | Same | Same | Same | Same | Same |
| Resin flow (mm) | less than 0.05 | less than 0.1 | less than 0.1 | less than 0.05 | less than 0.05 | less than 0.05 |

Remarks of Table 3
*1ethylene glycol diglycidyl ether manufactured by Kyoeisha Chemical Co., Ltd., having an epoxy equivalent of 125 to 145 and a viscosity of 15 to 35 cps at 25° C.
*2 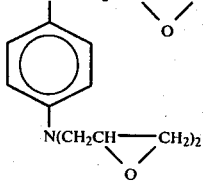 O—CH$_2$—CH—CH$_2$ having an epoxy equivalent of 100 and a viscosity of 700 cps at 25 ° C.
*3manufactured by Sakamoto Chemical Co., Ltd. having an epoxy equivalent of 164 and a viscosity of 82 cps at 20° C.
*4manufactured by Nippon Soda Co., Ltd., a 50% methyl ethyl solution of both terminal end carboxylated butadiene rubber modified with bisphenol A type epoxy resin having an epoxy equivalent of 1600 to 2100 and a viscosity of 60 to 80 cps at 25 ° C.
*5manufactured by Showa Denko K.K., diglycidyl hexahydropthalate having an epoxy equivalent of 145 to 160 and a viscosity of 200 to 400 cps at 25° C.
*6manufactured by Nippon Kayaku Co., Ltd, phenol novolak type epoxy resin having an epoxy equivalent of 175 to 195 and a softening point of 65 to 75° C.
*7manufactured by Union Carbide Corp., 3,4-epoxycyclohexylmethyl 3,4-epoxycyclohexane carboxylate having an epoxy equivalent of 131 to 143 and a viscosity of 350 to 450 cps at 25° C.
*83,3'-diaminodiphenyl sulfone
*9diazabicycloundecene

EXAMPLE 17

A pre-gel was formed by mixing 14.0 g of BENTON 27, 121.8 g of toluene and 4.2 g of 95% ethanol. A 59.5 g amount of NIPOL 1072, 25.5 g of HYCAR CTBN 1300×13, 23.0 g of EPOLITE 40E, and TETRADO-X were added to the pre-gel and the mixture was dissolved in 216.5 g of methyl ethyl ketone to obtain a chief ingredient solution. A 16.9 g amount of 4,4'-diaminodiphenylmethane and 1.0 g of diazabicycloundecene were dissolved in 112.8 g of methyl cellosolve and, then, this solution was mixed with the above-prepared chief ingredient solution to form an adhesive composition. A KAPTON film and a copper foil were bonded by using the adhesive composition in the same manner as described in Example 10.

The T-peel strength of the bonded sample was 1.2 kg/cm. No abnormal phenomenon was observed when the bonded sample was floated in a soldering bath at a temperature of 280° C. for 30 seconds. Resin flow was less than 0.05 mm.

EXAMPLE 18

A uniform chief ingredient solution was obtained by dissolving 34.0 g of NIPOL 1072, 51.0 g of HYCAR CTBN 1300×13, 23.0 g of trimethylolpropane triglycidyl ether EPOLITE 100MF (manufactured by Kyoeisha Chemical Co. Ltd., an epoxy equivalent of 135 to 165, a viscosity of 100 to 160 cps at 25° C.), and 23.0 g of TETRADO-X in 216.5 g methyl ethyl ketone and, then, adding thereto 10.0 g of AEROSIL #300 (finely divided silica manufactured by Nippon Aerosil Co., Ltd.), followed by the high speed agitation in a homomixer for 20 minutes. A 23.3 g amount of 3,3'-diaminodiphenyl sulfone and 1.0 g of diazabicycloundecene were dissolved in 70.9 g of methyl cellosolve. This solution was mixed with the chief ingredient solution obtained above. Thereafter, the procedure of Example 8 was repeated.

The T-peel strength was 1.2 kg/cm and no abnormal phenomenon was observed when the bonded sample was floated on a soldering bath at a temperature of 280° C. for 30 seconds. The resin flow was less than 0.05 mm.

EXAMPLE 19

A 14.0 g amount of BENTON 27 having a specific density of 1.8 at 25° C. and having a size passing through a 150 mesh sieve was charged into a 500 cm³ separable flask. Thereafter, 121.8 g of toluene was added to the flask, whereby BENTONE 27 was thoroughly wetted and, then, 4.2 g of 95% ethanol was added and stirred to form a pre-gel (soft creamy gel).

To the pre-gel, 21.86 g of bis A type epoxy resin R-301 (manufactured by Mitsui Petrochemical Epoxy Corp., an epoxy equivalent of 470 to 490 and a softening point of 62° C. to 70° C.), 51.0 g of HYCAR CTBN 1300×13, 34.0 g of NIPOL 1072 (previously masticated on rolls and cut into small chips), and 219.4 g of methyl ethyl ketone were added. The mixture was dissolved while stirring at room temperature until a uniform solution was formed. To the solution thus obtained, 20.6 g of N,N,N',N',-tetraglycidyl-m-xylylene diamine TETRADO-X was added and dissolved therein to prepare a chief ingredient solution.

To the chief ingredient solution obtained above, a solution of 15.2 g of 3,3'-diaminodiphenyl sulfone, 1.0 g of diazabicyclo undecene, and 0.024 g of triphenyl phosphine dissolved in 81.2 g of methyl cellosolve was added as a curing agent component. Thus, an adhesive composition was prepared.

The adhesive composition was applied to the surface of KAPTON film and was dried at a temperature of 130° C. for 10 minutes in an air oven. The film was laminated with a copper foil in such a manner that the adhesive composition is contacted with the matte surface of the copper foil. The laminate was subjected to a contact bonding under a pressure of 40 kg/cm² for 90 minutes in a press after previously heating at a temperature of 170° C. for 2 minutes.

The thickness of the adhesive layer of the sample obtained above was 22 to 25 m. The T-peel strength was 1.6 kg/cm. Abnormal phenomena such as blistering were not observed when the sample was floated on a soldering bath at a temperature of 280° C. for 2 minutes with the copper foil face down.

The maximum length of the adhesive composition flown to the opening was less than 0.03 mm.

EXAMPLE 20

A 70.0 g amount of HYCAR CTBN 1300×13 and 18.0 g of R-301 were dissolved in 88.0 g of methyl cellosolve at room temperature in a 500 cm³ separable flask. A 6.8 g amount of BENTON 27 was gradually added to 45.0 g of methyl cellosolve agitated at a high speed in a homomixer to prepare a suspension. This suspension was added to the solution prepared above. Then, 8.8 g of AEROSIL 380 and 17.0 g of TETRADO-X were further added thereto and the mixture was stirred at room temperature for 3 hours to prepare a chief ingredient solution.

To the chief ingredient solution thus obtained, a curing agent composition prepared by dissolving 12.5 g of 3,3'-diaminodiphenyl sulfone, 0.80 g of diazabicycloundecene, and 0.02 g of triphenyl phosphine in 37.4 g of methyl cellosolve was added. Thus, an adhesive composition was prepared.

The adhesive composition thus prepared was applied to the surface of KAPTON film and was dried at a temperature of 150° C. for 10 minutes. Thereafter, the film was laminated with a copper foil in such a manner that the adhesive layer was contacted with the matte surface of the copper foil. The laminate was previously dried at a temperature of 170° C. for 2 minutes on a press and, then, was contact bonded at a temperature of 170° C. under a press pressure of 20 kg/cm² for 40 minutes.

The thickness of the adhesive layer was 22 to 25 μm. The T-peel strength was 2.1 kg/cm. Abnormal phenomena such as blistering were not observed when the sample was floated on a soldering bath at a temperature of 280° C. for 2 minutes with the copper foil face down. The maximum flow length of the adhesive composition was 0.1 mm.

EXAMPLES 21 TO 24

The chief ingredient solution as used in Example 19 was mixed with a curing agent composition listed in Table 4 to form an adhesive composition.

The same tests as in Example 19 were carried out. The results are shown in Table 4.

TABLE 4

| Example No. | Curing agent component (g) | Press condition | Drying condition (150° C.) | T-peel strength (kg/cm) | Soldering heat resistance (280° C.) | Maximum flow lenght of adhesive composition |
|---|---|---|---|---|---|---|
| 21 | 4,4'diaminodiphenylmethne/DBU*1/TPP*2/methyl cellosolve = 11.9/0.98/0.024/50.0 | 170° C. 40 min | 8 min | 1.7 | more than 2 min | less than 0.05 mm |
| 22 | Dicyanodiamide/2E4MZ-AZINE*3/dimethyl formamide = 3.04/0.5/50.0 | 170° C. 80 min 30 kg/cm² | 15 min | 1.8 | more than 2 min | less than 0.05 mm |
| 23 | Phthalic anhydride/dimethyl formamide = 14.6/50.0 | 170° C. 90 min 30 kg/cm² | 12 min | 1.2 | more than 2 min | less than 0.05 mm |
| 24 | 2E4MZ-CN*4/methyl cellosive = 3.88/50.0 | 170° C. 60 min | 6 min | 1.9 | more than 2 min | less than 0.05 mm |

TABLE 4-continued

| Example No. | Curing agent component (g) | Press condition | Drying condition (150° C.) | T-peel strength (kg/cm) | Soldering heat resistance (280° C.) | Maximum flow lenght of adhesive composition |
|---|---|---|---|---|---|---|
| | | 30 kg/cm$^2$ | | | | |

*1 diazabicycloundecene
*2 triphenyl phosphine

*3 
$H_2N$—C(=N)—N=C(—NH$_2$)—N—CH$_2$CH$_2$—N—C(CH$_3$)=N—N=C(CH$_2$H$_5$) (structure shown)

*4
NCCH$_2$CH$_2$—N—C(CH$_3$)=N with CH$_2$H$_5$ substituent

EXAMPLE 25

A 5.0 g amount of octadecyltrimethylammonium acetate and 12.5 cm$^3$ of methanol were added to a 200 cm$^3$ flask and the mixture was dissolved. Thereafter, 25.0 g of sepiolite ADEPLUS SP (manufactured by Takeda Chemical Industries Ltd., a size of 100 to 324 meshes) was added to the solution and mixed while stirring. The mixture was collected in an evaporating dish and was dried in a vacuum oven at a temperature of 50° C. The dried solid was thoroughly crushed in a mortar.

By using 14.0 g of ADEPLUS SP treated with octadecyltrimethylammonium acetate was used instead of BENTON 27, Example 19 was repeated.

The thickness of the adhesive layer after KAPTON film and the matte surface of a copper foil were bonded was 22 to 25 μm and the T-peel strength was 1.6 kg/cm. Abnormal phenomena such as blistering was not observed when the sample was floated on the soldering bath at a temperature of 280° C. for 2 minutes. The maximum flow length of the adhesive composition during the contact bonding on the mirror surface of the copper foil under a pressure of 40 kg/cm$^2$ was less than 0.04 mm.

COMPARATIVE EXAMPLE 4

Example 19 was repeated, except that no BENTON 27 was used.

The T-peel strength was 1.1 kg/cm and the maximum flow length of the adhesive composition during the contact bonding on a mirror surface of the copper foil was more than 1.0 mm.

EXAMPLE 26

Example 19 was repeated, except that N,N,N',N',N'',N''-hexaglycidyl-1,3,5-triaminomethylbenzene having an epoxy equivalent of 90 was used instead of TETRADO-X.

The T-peel strength was 1.5 kg/cm, the soldering heat resistance was such that abnormal phenomena such as blistering were not observed when the sample was floated on a soldering bath at a temperature of 280° C. for 2 minutes. The maximum flow length of the adhesive composition was less than 0.03 mm.

EXAMPLE 27

Example 20 was repeated, except that 6.8 g of finely divided silica AEROSIL 380 was used instead of BENTON 27.

The thickness of the adhesive layer between the KAPTON film and the matte surface of the copper foil was 22 to 25 μm. The T-peel strength was 2.0 kg/cm and abnormal phenomena such as blistering were not observed when the sample was floated on the soldering bath at a temperature of 280° C. for 2 minutes. The maximum flow length of the adhesive composition during the contact bonding on the mirror surface of the copper foil under a pressure of 20 kg/cm$^2$ was less than 0.1 mm.

EXAMPLE 28

By using bisphenol A type epoxy resin R-301 (component (a)), N,N,N',N'-tetraglycidyl-m-xylylenediamine TETRADO-X (component (b)), and carboxylated nitrile rubber HYCAR CTBN 1300×13 (component (c)) in amounts listed in Table 5, the adhesive compositions having various mole ratios [(a)+(b)]/(c) were prepared in the manner as described in Example 1.

The T-peel strengths of the laminates obtained in the manner as described in Example 1 from the adhesive compositions prepared above are shown in Table 5.

TABLE 5

| Run No. | Component (a) (g) | Component (b) (g) | Component (c) (g) | Mole Ratio (b)/(a) | (a) + (b)/(c) | T-peel strength (kg/cm) |
|---|---|---|---|---|---|---|
| 1 | 1.8 | 1.7 | 80.0 | 0.944 | 0.05 | 0.8 |
| 2 | 3.6 | 3.4 | " | " | 0.09 | 0.9 |
| 3 | 7.2 | 6.8 | " | " | 0.17 | 1.2 |
| 4 | 18 | 17 | " | " | 0.44 | 2.1 |
| 5 | 24.5 | 23.1 | " | " | 0.59 | 1.5 |
| 6 | 28.8 | 27.2 | " | " | 0.7 | 1.0 |
| 7 | 57.6 | 54.4 | " | " | 1.75 | 0.8 |

TABLE 5-continued

| Run No. | Component (a) (g) | Component (b) (g) | Component (c) (g) | Mole Ratio (b)/(a) | (a) + (b)/(c) | T-peel strength (kg/cm) |
|---|---|---|---|---|---|---|
| 8* | 79.2 | 74.8 | " | " | 1.93 | 0.6 |

*Comparative run

COMPARATIVE EXAMPLE 5

An adhesive composition was prepared, in the manner as described in Example 1, from 26.9 of carboxylated nitrile rubber NIPOL 1072, 89.0 g of bisphenol A type epoxy resin 11.0 g of poly N-glycidyl type epoxy resin CIBA 0510, 170.9 g of methyl ethyl ketone, 4.44 g of dicyanodiamide and 2.86 g of p-chlorophenyl-dimethyl urea.

The adhesive composition thus prepared was applied to a surface of polyimide film KAPTON and, then, was dried at a temperature of 120° C. for 6 minutes in an air oven. Thereafter, the film was laminated on a copper foil in such a manner that the adhesive layer of the film was contacted with the matte surface of the copper foil. The laminate was contact bonded at a temperature of 121° C. under a pressure of 40 kg/cm² for 60 minutes in a press.

The T-peel strength of the sample was 1.5 kg/cm, but the maximum flow length of the adhesive composition was more than 2 mm.

I claim:

1. An adhesive composition comprising: (a) a nitrogen atom-free epoxy compound, (b) a poly-N-glycidyl epoxy resin, and (c) a nitrile rubber having a carboxyl group, the compounding ratio by weight of the components (a), (b), and (c) in the composition being as follows:

$0.05 \leq (b)/(a) \leq 19$
   $0.05 \leq [(a)+(b)]/(c) \leq 1.75$.

2. An adhesive composition as claimed in claim 1, wherein said nitrogen atom-free epoxy compound is a glycidyl ether of alcohol, a glycidyl ester of carboxylic acid, a glycidyl ether of phenol, or an epoxy compound having a skeleton of

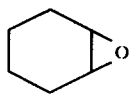

in the molecule thereof.

3. An adhesive composition comprising: (a) a nitrogen atom-free epoxy compound, (b) a poly-N-glycidyl epoxy resin, (c) a nitrile rubber having a carboxyl group, and (d) a finely divided silica, a clay substance treated with an onium compound, or a mixture thereof, the compounding ratio by weight of the components (a), (b), (c), and (d) being as follows:

$0.05 \leq (b)/(a) \leq 19$
   $0.05 \leq [(a)+(b)]/(c) \leq 1.75$
   $0.0125 \leq (d)/(c) \leq 0.75$.

4. An adhesive composition as claimed in claim 3, wherein said nitrogen atom-free epoxy compound is a glycidyl ether of alcohol, a glycidyl ester of carboxylic acid, a glycidyl ether of phenolic compound, or an epoxy compound having a skeleton of

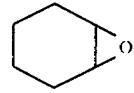

in the molecule thereof.

5. A method for forming FPC by applying an adhesive composition to a heat stable plastic film, laminating the film to a metallic foil, and then contact bonding the laminate, said adhesion composition containing (a) a nitrogen atom-free epoxy compund, (b) a poly N-glycidyl epoxy resin, and (c) a nitrile rubber having a carboxyl group, the compounding ratio by weight of the components (a), (b), and (c) in the composition being as follows:

$0.05 \leq (b)/(a) \leq 19$
   $0.05 \leq [(a)+(b)]/(c) \leq 1.75$.

6. A method as claimed in claim 5, wherein said adhesive composition further contains (d) a finely divided silica, a clay substance treated with an onium compound, or a mixture thereof, the compounding ratio by weight of the component (c) to the component (d) being 0.0125 to 0.75.

* * * * *